(12) United States Patent
Yoon et al.

(10) Patent No.: US 11,552,576 B2
(45) Date of Patent: Jan. 10, 2023

(54) POWER APPARATUS INCLUDING INTERLOCK

(71) Applicants: Hyundai Motor Company, Seoul (KR); Kia Motors Corporation, Seoul (KR)

(72) Inventors: Jae Hoon Yoon, Seoul (KR); Sang Chan Jeong, Seoul (KR); Hyong Joon Park, Hwaseong-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 303 days.

(21) Appl. No.: 16/918,222

(22) Filed: Jul. 1, 2020

(65) Prior Publication Data

US 2021/0184590 A1 Jun. 17, 2021

(30) Foreign Application Priority Data

Dec. 16, 2019 (KR) .......................... 10-2019-0167719

(51) Int. Cl.
*H02G 5/02* (2006.01)
*H02M 7/00* (2006.01)
*H05K 5/02* (2006.01)

(52) U.S. Cl.
CPC .............. *H02M 7/003* (2013.01); *H02G 5/02* (2013.01); *H05K 5/0208* (2013.01)

(58) Field of Classification Search
CPC .......... H02G 5/02; H02M 7/003; H02M 7/00; H02M 7/48; H05K 5/0208; H05K 5/02; H05K 7/1432; H05K 1/14; H01R 31/08

USPC ......................................................... 361/807
See application file for complete search history.

(56) References Cited

U.S. PATENT DOCUMENTS 5,902,138 A * 5/1999 Murakami ........... H01R 9/2466
439/76.2
2011/0127154 A1 6/2011 Oh et al.

FOREIGN PATENT DOCUMENTS

JP 2017118765 A * 6/2017 ............. H01R 31/08
KR 20110061057 A 6/2011
KR 101567261 B1 11/2015

* cited by examiner

*Primary Examiner* — Timothy J Thompson
*Assistant Examiner* — Guillermo J Egoavil
(74) *Attorney, Agent, or Firm* — Slater Matsil, LLP

(57) ABSTRACT

A power apparatus includes a first power bus bar provided at a first power part, a second power bus bar provided at a second power part coupled to the first power part while communicating internally with the first power part, the second power bus bar being fastened to the first power bus bar, a first interlock bus bar provided at the first power part while being connected to an interlock terminal of a controller disposed within the first power part, a second interlock bus bar provided at the second power part while being fastened to the first interlock bus bar, and a safety cover fastened to a fastening portion between the first interlock bus bar and the second interlock bus bar while covering a fastening portion between the first power bus bar and the second power bus bar.

20 Claims, 6 Drawing Sheets

POWER APPARATUS INCLUDING INTERLOCK

CROSS-REFERENCE TO RELATED APPLICATIONS

This application claims priority to Korean Patent Application No. 10-2019-0167719, filed in the Korean Intellectual Property Office on Dec. 16, 2019, which application is hereby incorporated herein by reference.

TECHNICAL FIELD

The present invention relates to a power apparatus including an interlock.

BACKGROUND

A power converter and a high-voltage branch box, which are included in an eco-friendly vehicle such as an electric vehicle, are manufactured to have an integrated structure through inter-coupling thereof. In this case, the housing of the power converter and the housing of the high-voltage branch box are coupled such that inner spaces thereof communicate with each other. Interlock terminals provided at a controller included in the power converter are electrically connected to respective connectors of the high-voltage branch box.

FIG. 1 shows an example of a conventional power apparatus including an interlock.

As shown in FIG. 1, the conventional power apparatus, which is provided with an interlock, includes a power converter 10 and a high-voltage branch box 20, which are inter-connected. The power converter 10 and the high-voltage branch box 20 may have structures in which housings 15 and 26 thereof are coupled such that inner spaces of the housings 15 and 26 communicate with each other.

An inverter 11 included in the power converter 10 receives high-voltage DC power from the high-voltage branch box 20, and converts the received power into 3-phase AC power. High-voltage bus bars 121 and 122 extending from the inverter 11 are coupled with high-voltage bus bars 221 and 222 disposed in the high-voltage branch box 20 through bolt-couplings B1 and B2, respectively, and, as such, electrical connection thereof may be obtained.

In addition, the inverter 11 includes a controller 110 configured to control a plurality of power semiconductor switches (not shown) used for power conversion. The controller 110 has interlock terminals adapted to determine whether or not a particular element or a portion of the element is in an electrical connection state.

In detail, the controller 110 has interlock terminals adapted to determine whether or not a maintenance hole cover 13 provided at the power converter 1l is separated. As shown in FIG. 1, connection is established between two respective interlock terminals of the controller 110 and a connector C1 provided at the maintenance hole cover 13 by respective interlock wires 14. When the maintenance hole cover 13 is opened, the interlock wires 14 are opened as the connector C1 is disconnected therefrom. As a result, the controller 110 releases high-voltage connection of a vehicle in which the power apparatus is installed. That is, when the maintenance hole cover 13 is opened, high voltage is interrupted to cope with access of the operator to a maintenance hole in an opened state of the maintenance hole cover 13, for safety.

In addition, another interlock terminal of the controller 110 is electrically connected to an interlock wire 24 provided at the high-voltage branch box 20 through a connector C2. The interlock wire 24 of the high-voltage branch box 20 is also connected to the ground via several high-voltage connectors 25 provided at the high-voltage branch box 20. When the connector C2 is separated, or another connector connected to any one of the connectors 25 is separated, the interlock terminal of the controller 110 transitions from a ground state to a floating state and, as such, may interrupt a high voltage.

Such a conventional interlock structure has a drawback in that there is a great limitation of space. Furthermore, since the number of pins in each connector is small, there may be a problem in that the conventional interlock structure may be weaker than high-voltage bus bars in terms of coupling force. For this reason, there may be a problem in that contacts may fail due to vehicle vibration, thereby causing malfunction.

The above matters disclosed in this section are merely for enhancement of understanding of the general background of the invention and should not be taken as an acknowledgement or any form of suggestion that the matters form the related art already known to a person skilled in the art.

SUMMARY

The present invention relates to a power apparatus including an interlock. Particular embodiments relate to a power apparatus including an interlock, which is capable of achieving simplification and robustness of an interlock structure applied to a power apparatus configured through coupling of two power parts.

Therefore, embodiments of the present invention have been made in view of problems, and embodiments of the present invention provide a power apparatus including an interlock, which is capable of achieving simplification and robustness of an interlock structure applied to a power apparatus configured through coupling of two power parts.

An embodiment of the present invention provides a power apparatus including a first power bus bar provided at a first power part, a second power bus bar provided at a second power part coupled to the first power part while communicating internally with the first power part, the second power bus bar being fastened to the first power bus bar, a first interlock bus bar provided at the first power part while being connected to an interlock terminal of a controller disposed within the first power part, a second interlock bus bar provided at the second power part while being fastened to the first interlock bus bar, and a safety cover fastened to a fastening portion between the first interlock bus bar and the second interlock bus bar while covering a fastening portion between the first power bus bar and the second power bus bar.

The first power part may include a housing having a maintenance hole to allow access to the fastening portion between the first power bus bar and the second power bus bar. The safety cover may be disposed at the fastening portion between the first power bus bar and the second power bus bar at a side of the maintenance hole.

The first interlock bus bar and the second interlock bus bar may be maintained to be spaced apart from each other in a state of overlapping with each other in one direction before being fastened to each other under a condition that the first power part and the second power part are coupled.

The first interlock bus bar, the second interlock bus bar and the safety cover may be fastened together by a bolt to be in contact with one another.

In an embodiment, the first interlock bus bar, the second interlock bus bar and the safety cover may be fastened to a portion of the first power part. A bolt fastening hole may be formed at the portion of the first power part. The bolt fastening hole may have a depth determined such that a distance from an end of the bolt to an end of the bolt fastening hole is smaller than a thickness of the safety cover under a condition that the first interlock bus bar, the second interlock bus bar and the safety cover are fastened.

In another embodiment, the first interlock bus bar, the second interlock bus bar and the safety cover may be fastened to a portion of the first power part. The bolt may have a thread length determined to be smaller than a sum of a thickness of the first interlock bus bar, a thickness of the second interlock bus bar, a thickness of the safety cover and a depth of a bolt fastening hole formed at the portion of the first power part while being greater than a sum of the thickness of the first interlock bus bar, the thickness of the second interlock bus bar and the depth of the bolt fastening hole.

In another embodiment of the present invention, there is provided a power apparatus including a power converter including a housing, an inverter disposed within the housing, a controller disposed within the housing to control the inverter while having an interlock terminal, a first power bus bar disposed within the housing while being connected to a DC stage of the inverter, a first interlock bus bar disposed within the housing while being connected to the interlock terminal, and a maintenance hole formed at the housing to allow access to an interior of the housing from an exterior of the housing, a high-voltage branch box coupled to the power converter while communicating internally with the power converter, the high-voltage branch box including a second power bus bar fastened to the first power bus bar at a position allowing access thereto through the maintenance hole, and a second interlock bus bar fastened to the first interlock bus bar at the position, and a safety cover fastened together with the first interlock bus bar and the second interlock bus bar while being disposed at a fastening portion between the first power bus bar and the second power bus bar at a side of the maintenance hole, to cover a fastening portion between the first power part and the second power part.

The first interlock bus bar and the second interlock bus bar may be maintained to be spaced apart from each other in a state of overlapping with each other in one direction before being fastened to each other under a condition that the power converter and the high-voltage branch box are coupled.

The first interlock bus bar, the second interlock bus bar and the safety cover may be fastened together by a bolt to be in contact with one another.

In an embodiment, the first interlock bus bar, the second interlock bus bar and the safety cover may be fastened to a portion of the power converter. A bolt fastening hole is formed at the portion of the power converter. The bolt fastening hole may have a depth determined such that a distance from an end of the bolt to an end of the bolt fastening hole is smaller than a thickness of the safety cover under a condition that the first interlock bus bar, the second interlock bus bar and the safety cover are fastened.

In another embodiment, the first interlock bus bar, the second interlock bus bar and the safety cover may be fastened to a portion of the first power part. The bolt may have a thread length determined to be smaller than a sum of a thickness of the first interlock bus bar, a thickness of the second interlock bus bar, a thickness of the safety cover and a depth of a bolt fastening hole formed at the portion of the first power part while being greater than a sum of the thickness of the first interlock bus bar, the thickness of the second interlock bus bar and the depth of the bolt fastening hole.

In accordance with the interlock-included power apparatus, it may be possible not only to simplify an interlock structure through elimination of an interlock connection structure from a maintenance hole cover provided at power parts, but also to achieve robustness of the interlock structure by achieving interlock connection between the power parts through bolt-fastening, in place of a connector connection using wires.

In addition, in accordance with the interlock-included power apparatus, the safety cover adapted to cover the fastening portions of the high-voltage bus bars is fastened together with the interlock bus bars such that the safety cover cannot be separated without separation of the interlock bus bars. Accordingly, when the safety cover is separated, the controller surely interrupts a high voltage through release of the interlock connection. As such, an electric shock accident may be prevented.

Effects attainable in embodiments of the present invention are not limited to the above-described effects, and other effects of the embodiments of the present invention not yet described will be more clearly understood by those skilled in the art from the following detailed description.

BRIEF DESCRIPTION OF THE DRAWINGS

The above and other objects, features and other advantages of embodiments of the present invention will be more clearly understood from the following detailed description taken in conjunction with the accompanying drawings, in which.

DETAILED DESCRIPTION OF ILLUSTRATIVE EMBODIMENTS

Reference will now be made in detail to the preferred embodiments of the present invention associated with a power apparatus including an interlock, examples of which are illustrated in the accompanying drawings. Wherever possible, the same reference numbers will be used throughout the drawings to refer to the same or like parts.

Figure 2:
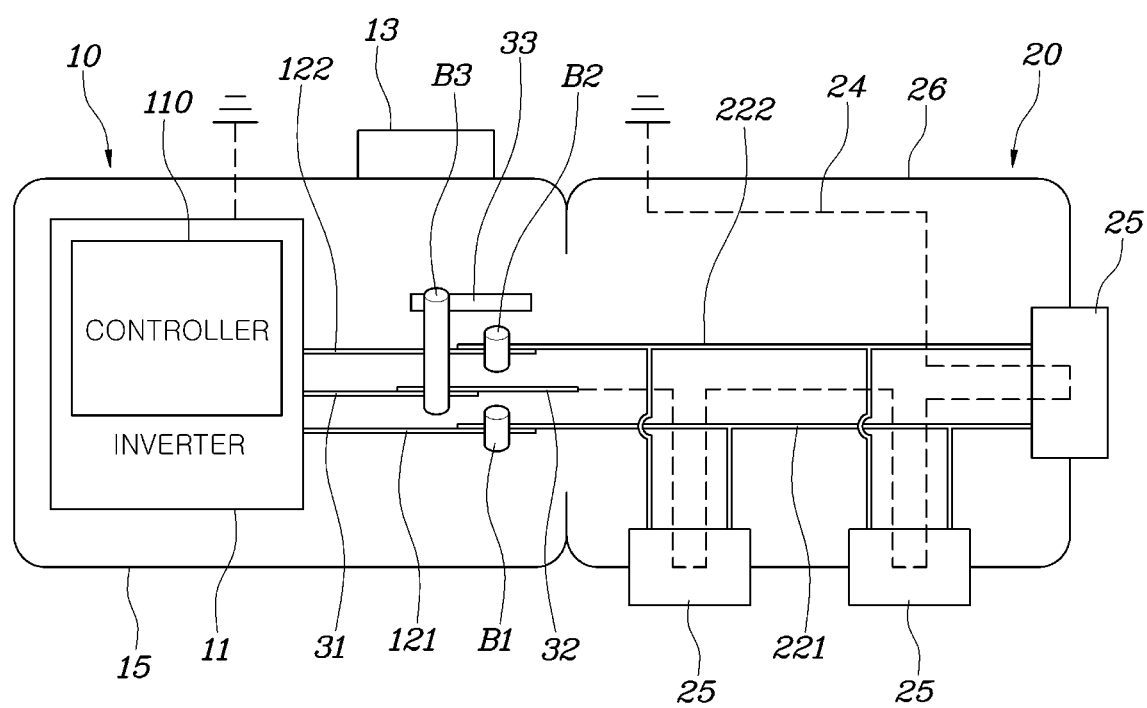
FIG. 2 is a view illustrating an example of a power apparatus including an interlock according to an embodiment of the present invention.
Figure 3:
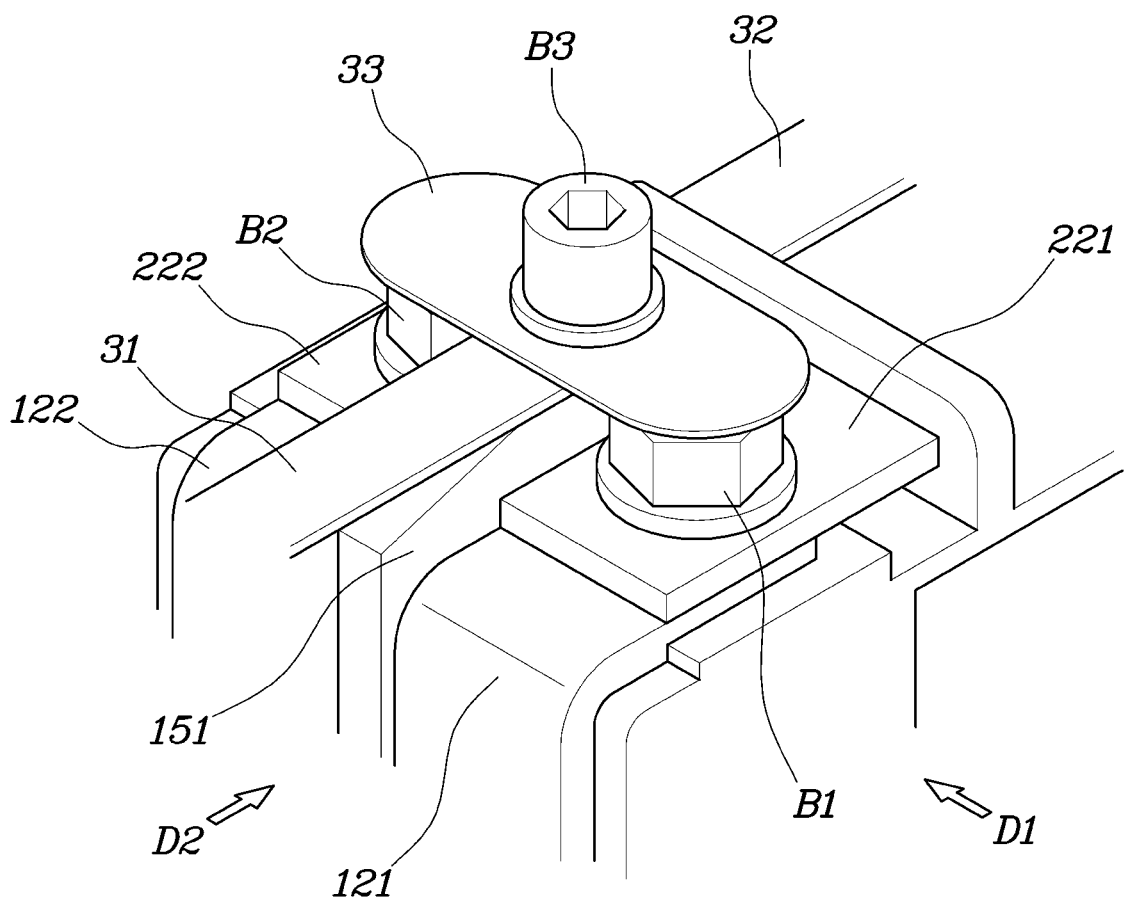
FIG. 3 is a perspective view illustrating high-voltage bus bars and an interlock connection structure in the interlock-included power apparatus according to the embodiment of the present invention.
Figure 4:
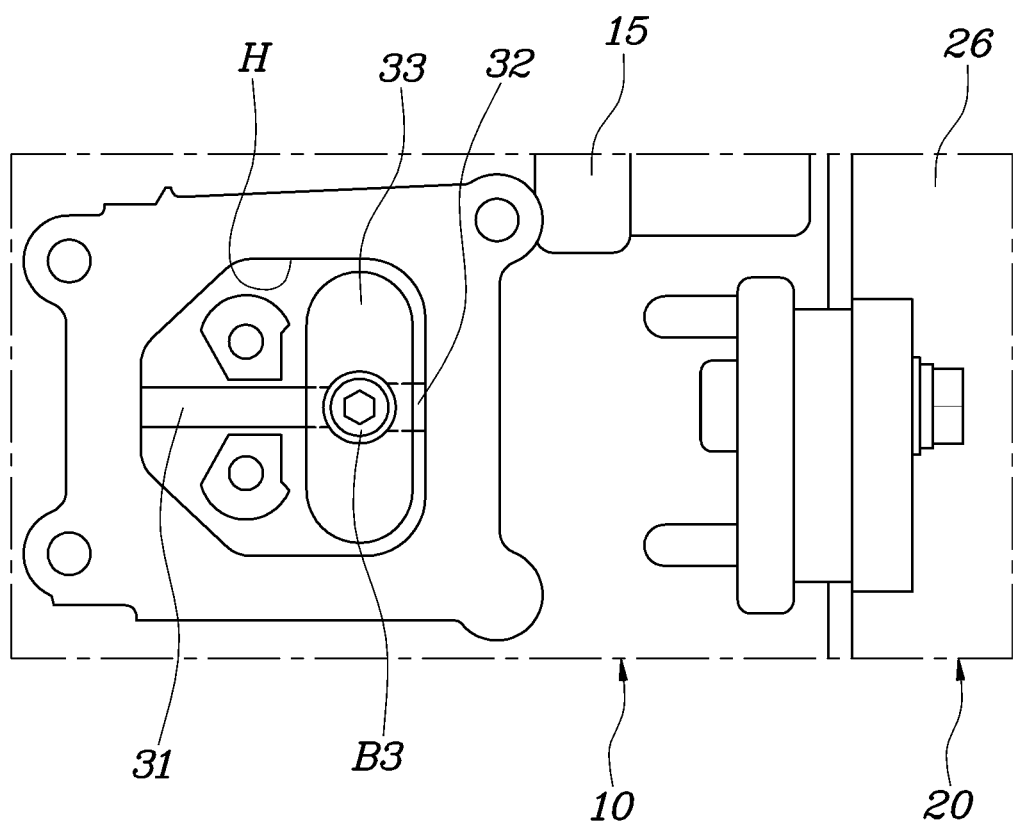
FIG. 4 is a plan view of the high-voltage bus bars and the interlock connection structure shown in FIG. 2.
Figure 5:
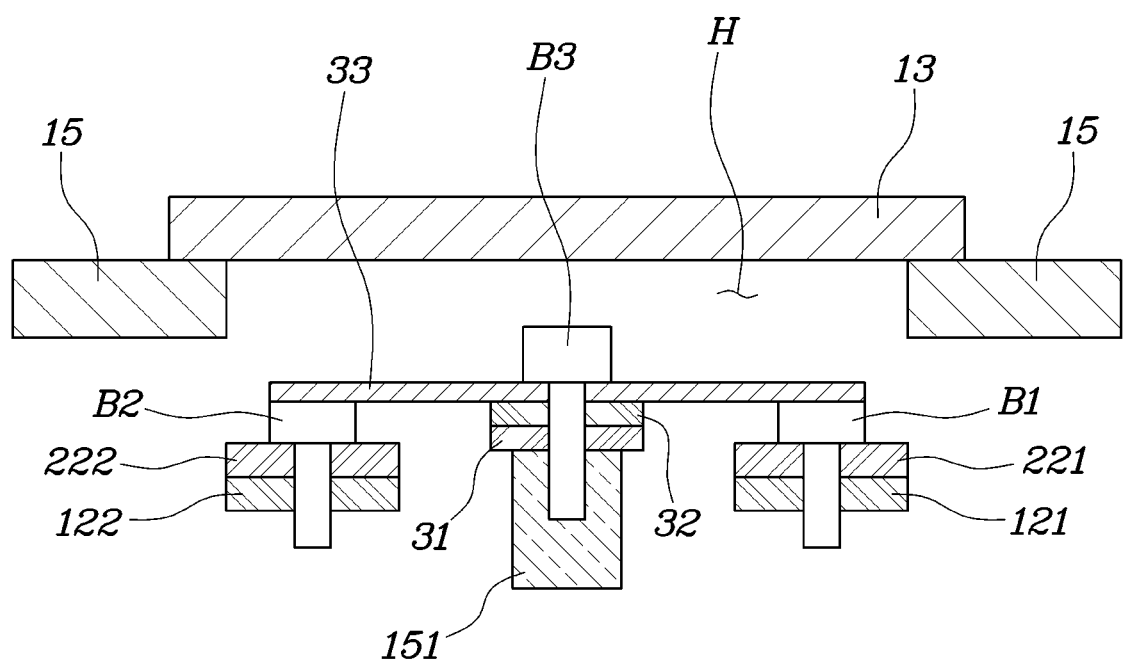
FIG. 5 is a side view of the high-voltage bus bars and the interlock connection structure shown in FIG. 3 when viewed in a direction D1.

FIG. 2 is a view illustrating an example of a power apparatus including an interlock according to an embodiment of the present invention. FIG. 3 is a perspective view illustrating high-voltage bus bars and an interlock connection structure in the interlock-included power apparatus according to an embodiment of the present invention. FIG. 4 is a plan view of the high-voltage bus bars and the interlock connection structure shown in FIG. 2. FIG. 5 is a side view of the high-voltage bus bars and the interlock connection structure shown in FIG. 3 when viewed in a direction D1.

Referring to FIGS. 2 to 5, the interlock-included power apparatus according to embodiments of the present invention may include first power bus bars 121 and 122 provided at a first power part 10, and second power bus bars 221 and 222 provided at a second power part 20 coupled to the first power part 10 while communicating internally with the first power part 10. The second power bus bars 221 and 222 are fastened to the first power bus bars 121 and 122, respectively. The power apparatus may further include a first interlock bus bar 31 provided at the first power part 10 while being connected to an interlock terminal of a controller 110 disposed within the first power part 10, a second interlock bus bar 32 provided at the second power part 20 while being fastened to the first interlock bus bar 31, and a safety cover 33 fastened to a fastening portion B3 between the first interlock bus bar 31 and the second interlock bus bar 32 while covering a fastening portion B1 between the first power bus bar 121 and the second power bus bar 221 and a fastening portion B2 between the first power bus bar 122 and the second power bus bar 222.

The first power part 10 may be a power converter including an inverter 11, whereas the second power part 20 may be a high-voltage branch box. Housings 15 and 26 of the first and second power parts 10 and 20 may be opened at facing areas thereof. The opened areas of the housings 15 and 26 may be coupled such that interiors of the housings 15 and 26 communicate with each other.

The power converter 10 may include a maintenance hole H extending between an interior of the housing 15 and an exterior of the housing 15, for maintenance. The safety cover 33 may be disposed at the fastening portions B1 and B2 for fastening the first power bus bars 121 and 122 and the second power bus bars 221 and 222 at the side of the maintenance hole H and, as such, may be fastened together with the first and second interlock bus bars 31 and 32 by a bolt B3. Here, reference numerals "B1" and "B2" may designate fastening portions of the first power bus bars 121 and 122 and the second power bus bars 221 and 222 or bolts used to fasten the first power bus bars 121 and 122 and the second power bus bars 221 and 222. Similarly, reference numeral "B3" may designate a fastening portion at which the first interlock bus bar 31, the second interlock bus bar 32 and the safety cover 33 are fastened together or a bolt used to fasten those members.

By virtue of such disposition of the safety cover 33, even when the operator inserts their hand or a tool into the power converter 10 through the maintenance hole H, it may be possible to prevent the operator from directly contacting the fastening portions of the first power bus bars 121 and 122 and the second power bus bars 221 and 222. In the conventional case, the interlock connector is provided at the maintenance hole cover covering the maintenance hole H such that, when the maintenance hole cover is separated from the housing 15, a high voltage is interrupted and, as such, an electric shock accident is prevented. In embodiments of the present invention, however, the interlock connector is eliminated to simplify the interlock structure, and, in place thereof, the safety cover 30 is additionally provided to cope with an electric shock accident.

In particular, the safety cover 30 is fastened together with the interlock bus bars 31 and 32 by the bolt B3 and, as such, cannot be separated without unfastening of the interlock bus bars 31 and 32. That is, when it is desired to separate the safety cover 30, fastening of the interlock bus bars 31 and 32 should be released first. In practice, the interlock bus bars 31 and 32 are unfastened simultaneously with separation of the safety cover 30. Accordingly, the controller 110 may interrupt a high voltage before the operator accesses the fastening portions B1 and B2 of the high-voltage bus bars 121, 122, 221 and 222.

Figure 1:
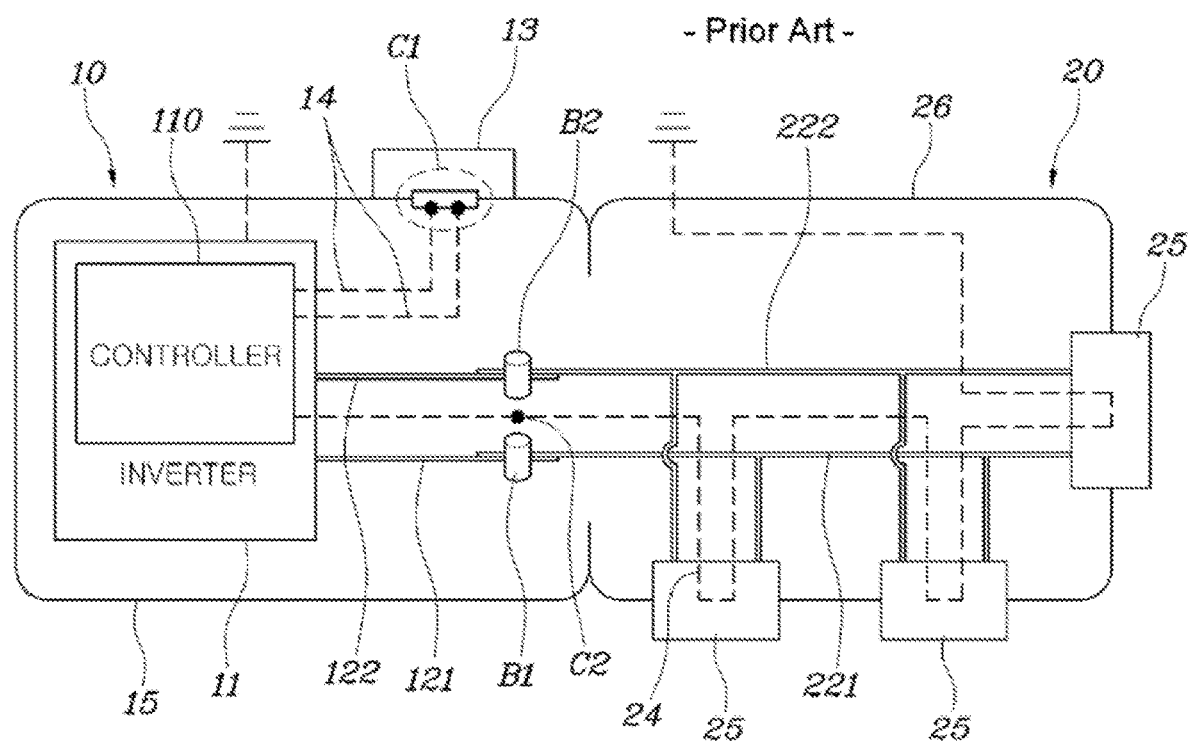
FIG. 1 shows an example of a conventional power apparatus including an interlock.

As such, as compared to the conventional interlock structure shown in FIG. 1, the interlock-included power apparatus according to the embodiments of the present invention is characterized in that the interlock connector provided at the maintenance hole cover 13 is eliminated, and interlock connection between the first power part 10 (power converter) and the second power part 20 (high-voltage branch box) is realized through bolt fastening using bus bars, in place of simple wire connection.

Thus, it may be possible to simplify the interlock structure through elimination of the interlock connection structure from the maintenance hole cover 13. It may also be possible to achieve robustness of the interlock connection between the first power part 10 (power converter) and the second power part 20 (high-voltage branch box) through bolt-fastening. Furthermore, the safety cover 33 is fastened together with the interlock bus bars 31 and 32 such that the safety cover 33 cannot be removed without separation of the interlock bus bars 31 and 32 from each other. That is, when the safety cover 22 is separated, the controller 110 interrupts a high voltage in accordance with release of the interlock connection and, as such, an electric shock accident may be prevented.

An embodiment of the present invention has the following technical features in order to surely separate the two interlock bus bars 31 and 32 from each other when the bolt B3 adapted to fasten the safety cover 33 and the interlock bus bars 31 and 32 is separated.

Figure 6:
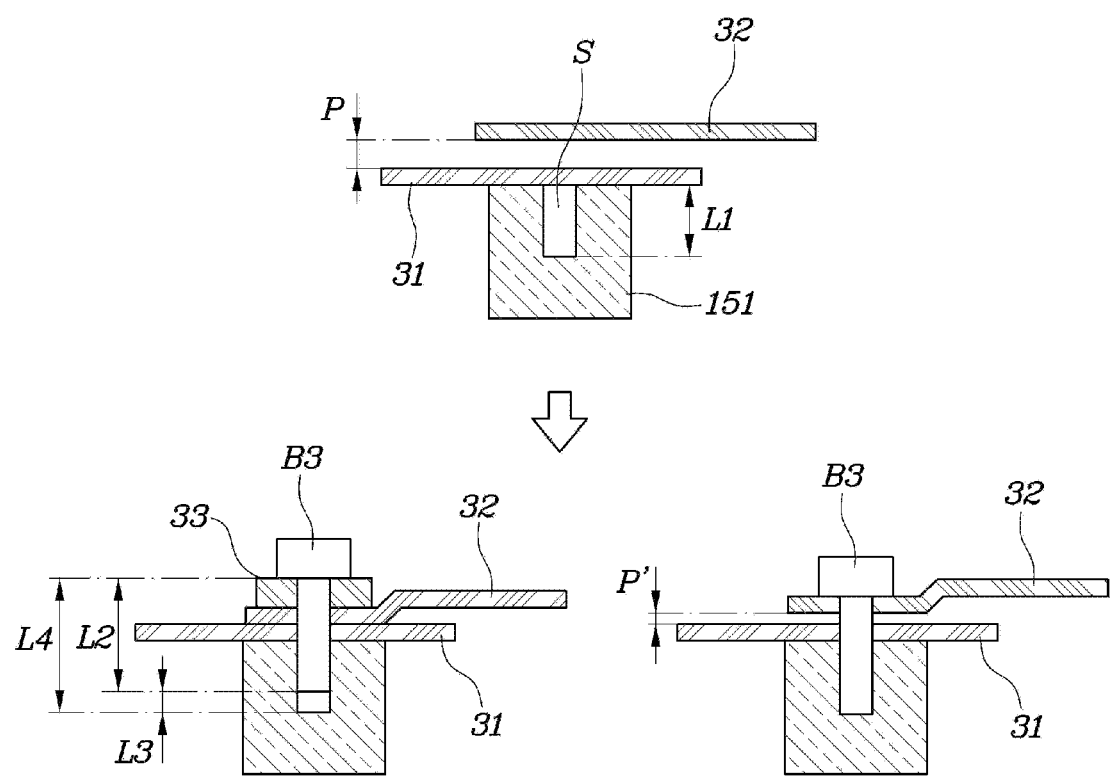
FIG. 6 is a side view of states before and after coupling of the interlock connection structure shown in FIG. 3 when viewed in a direction D2.

FIG. 6 is a side view of states before and after coupling of the interlock connection structure shown in FIG. 3 when viewed in a direction D2.

As shown in FIG. 6, the first interlock bus bar 31 and the second interlock bus bar 32 may be maintained to be spaced apart from each other in a state of overlapping with each other in a vertical direction before being fastened to each other under the condition that the first power part 10 (power converter) and the second power part 20 (high-voltage branch box) are coupled. Accordingly, electrical insulation is formed between the two interlock bus bars 31 and 32 in a state in which the interlock bus bars 31 and 32 are not fastened to each other.

Through fastening of the bolt B3, the first interlock bus bar 31, the second interlock bus bar 32 and the safety cover 33 may be fastened to a portion 151 of the first power part 10 (power converter). A bolt fastening hole S is formed at the portion 151 of the first power part 10 (power converter). In an embodiment of the present invention, the bolt fastening hole S formed at the portion 151 of the first power part 10 (power converter) may have a depth L1 preferably determined such that a distance L3 from an end of the bolt B3 to an end of the bolt fastening hole S is smaller than a thickness of the safety cover 33 under the condition that the first interlock bus bar 31, the second interlock bus bar 32 and the safety cover 33 are fastened.

Alternatively, the bolt B3 fastening the first interlock bus bar 31, the second interlock bus bar 32 and the safety cover 33 has a thread length L2 preferably determined to be smaller than a sum L4 of the thickness of the first interlock bus bar 31, the thickness of the second interlock bus bar 32, the thickness of the safety cover 33 and the depth of the bolt fastening hole S formed at the portion 151 of the first power part 10 while being greater than a sum of the thickness of the first interlock bus bar 31, the thickness of the second interlock bus bar 32 and the depth L1 of the bolt fastening hole S.

Accordingly, as shown in FIG. 6, even when the bolt B3 is fastened until the end of the bolt B3 reaches the end of the holt fastening hole S in a state in which the safety cover 33 is not fastened together with the first interlock bus bar 31 and the second interlock bus bar 32 due to operator carelessness, a predetermined space P' is formed between the first interlock bus bar 31 and the second interlock bus bar 32 and, as such, interlock connection cannot be obtained, thereby preventing application of a high voltage. That is, when the safety cover 33 is not fastened, electrical connection between the interlock bus bars 31 and 32 cannot be obtained. In this case, accordingly, the controller 110 maintains a high-voltage interruption state and, as such, an electrical shock accident caused by operator carelessness may be prevented.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power apparatus comprising:
   a first power bus bar provided at a first power part;
   a second power bus bar provided at a second power part coupled to the first power part while communicating internally with the first power part, the second power bus bar being fastened to the first power bus bar;
   a first interlock bus bar provided at the first power part while being connected to an interlock terminal of a controller disposed within the first power part;
   a second interlock bus bar provided at the second power part while being fastened to the first interlock bus bar; and
   a safety cover fastened to a first fastening portion between the first interlock bus bar and the second interlock bus bar while covering a second fastening portion between the first power bus bar and the second power bus bar;
   wherein the first power part comprises a housing having a maintenance hole to allow access to the second fastening portion between the first power bus bar and the second power bus bar; and
   wherein the safety cover is disposed at the second fastening portion between the first power bus bar and the second power bus bar at a side of the maintenance hole.

2. The power apparatus according to claim 1, wherein the first interlock bus bar and the second interlock bus bar are maintained to be spaced apart from each other in a state of overlapping with each other in one direction before being fastened to each other under a condition that the first power part and the second power part are coupled.

3. The power apparatus according to claim 2, wherein the first interlock bus bar, the second interlock bus bar and the safety cover are fastened together by a bolt to be in contact with one another.

4. The power apparatus according to claim 3, wherein:
   the first interlock bus bar, the second interlock bus bar and the safety cover are fastened to a portion of the first power part; and
   a bolt fastening hole is formed at the portion of the first power part.

5. The power apparatus according to claim 4, wherein the bolt fastening hole has a depth determined such that a distance from an end of the bolt to an end of the bolt fastening hole is smaller than a thickness of the safety cover under a condition that the first interlock bus bar, the second interlock bus bar and the safety cover are fastened.

6. The power apparatus according to claim 3, wherein the first interlock bus bar, the second interlock bus bar and the safety cover are fastened to a portion of the first power part.

7. A power apparatus comprising:
   a power converter comprising:
      a housing;
      an inverter disposed within the housing;
      a controller disposed within the housing to control the inverter while having an interlock terminal;
      a first power bus bar disposed within the housing while being connected to a DC stage of the inverter;
      a first interlock bus bar disposed within the housing while being connected to the interlock terminal; and
      a maintenance hole formed at the housing to allow access to an interior of the housing from an exterior of the housing;
   a high-voltage branch box coupled to the power converter while communicating internally with the power converter, the high-voltage branch box comprising:
      a second power bus bar fastened to the first power bus bar at a position allowing access thereto through the maintenance hole; and
      a second interlock bus bar fastened to the first interlock bus bar at the position; and
   a safety cover fastened together with the first interlock bus bar and the second interlock bus bar while being disposed at a first fastening portion between the first power bus bar and the second power bus bar at a side of the maintenance hole, to cover a second fastening portion between the power converter and the high-voltage branch box.

8. The power apparatus according to claim 7, wherein the first interlock bus bar and the second interlock bus bar are maintained to be spaced apart from each other in a state of overlapping with each other in one direction before being fastened to each other under a condition that the power converter and the high-voltage branch box are coupled.

9. The power apparatus according to claim 8, wherein the first interlock bus bar, the second interlock bus bar and the safety cover are fastened together by a bolt to be in contact with one another.

10. The power apparatus according to claim 9, wherein:
    the first interlock bus bar, the second interlock bus bar and the safety cover are fastened to a portion of the power converter; and
    a bolt fastening hole is formed at the portion of the power converter.

11. The power apparatus according to claim 10, wherein the bolt fastening hole has a depth determined such that a distance from an end of the bolt to an end of the bolt fastening hole is smaller than a thickness of the safety cover under a condition that the first interlock bus bar, the second interlock bus bar and the safety cover are fastened.

12. The power apparatus according to claim 9, wherein:
the first interlock bus bar, the second interlock bus bar and the safety cover are fastened to a portion of the power converter; and
the bolt has a thread length determined to be smaller than a sum of a thickness of the first interlock bus bar, a thickness of the second interlock bus bar, a thickness of the safety cover and a depth of a bolt fastening hole formed at the portion of the power converter while being greater than a sum of the thickness of the first interlock bus bar, the thickness of the second interlock bus bar and the depth of the bolt fastening hole.

13. A power apparatus comprising:
a power converter;
a first power bus bar provided at the power converter;
a high-voltage branch box coupled to the power converter while communicating internally with the power converter;
a second power bus bar provided at the high-voltage branch box, the second power bus bar being fastened to the first power bus bar;
a first interlock bus bar provided at the power converter while being connected to an interlock terminal of a controller disposed within the power converter;
a second interlock bus bar provided at the high-voltage branch box while being fastened to the first interlock bus bar; and
a safety cover fastened to a first fastening portion between the first interlock bus bar and the second interlock bus bar while covering a second fastening portion between the first power bus bar and the second power bus bar;
wherein the power converter comprises a housing having a maintenance hole to allow access to the second fastening portion between the first power bus bar and the second power bus bar; and
the safety cover is disposed at the second fastening portion between the first power bus bar and the second power bus bar at a side of the maintenance hole.

14. The power apparatus according to claim 13, wherein the first interlock bus bar and the second interlock bus bar are maintained to be spaced apart from each other in a state of overlapping with each other in one direction before being fastened to each other under a condition that the power converter and the high-voltage branch box are coupled.

15. The power apparatus according to claim 14, wherein the first interlock bus bar, the second interlock bus bar and the safety cover are fastened together by a bolt to be in contact with one another.

16. The power apparatus according to claim 15, wherein:
the first interlock bus bar, the second interlock bus bar and the safety cover are fastened to a portion of the power converter; and
a bolt fastening hole is formed at the portion of the power converter.

17. The power apparatus according to claim 16, wherein the bolt fastening hole has a depth determined such that a distance from an end of the bolt to an end of the bolt fastening hole is smaller than a thickness of the safety cover under a condition that the first interlock bus bar, the second interlock bus bar and the safety cover are fastened.

18. The power apparatus according to claim 15, wherein the first interlock bus bar, the second interlock bus bar and the safety cover are fastened to a portion of the power converter.

19. The power apparatus according to claim 18, wherein the bolt has a thread length determined to be smaller than a sum of a thickness of the first interlock bus bar, a thickness of the second interlock bus bar, a thickness of the safety cover and a depth of a bolt fastening hole formed at the portion of the power converter while being greater than a sum of the thickness of the first interlock bus bar, the thickness of the second interlock bus bar and the depth of the bolt fastening hole.

20. The power apparatus according to claim 6, wherein the bolt has a thread length determined to be smaller than a sum of a thickness of the first interlock bus bar, a thickness of the second interlock bus bar, a thickness of the safety cover and a depth of a bolt fastening hole formed at the portion of the first power part while being greater than a sum of the thickness of the first interlock bus bar, the thickness of the second interlock bus bar and the depth of the bolt fastening hole.

* * * * *